United States Patent
Shimada

(10) Patent No.: US 7,268,026 B2
(45) Date of Patent: Sep. 11, 2007

(54) METHOD FOR MANUFACTURING BOTH A SEMICONDUCTOR CRYSTALLINE FILM AND SEMICONDUCTOR DEVICE

(75) Inventor: Hiroyuki Shimada, Kofu (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/374,351

(22) Filed: Mar. 13, 2006

(65) Prior Publication Data

US 2006/0208286 A1 Sep. 21, 2006

(30) Foreign Application Priority Data

Mar. 15, 2005 (JP) ............................. 2005-072711

(51) Int. Cl.
*H01L 21/00* (2006.01)

(52) U.S. Cl. ............... 438/166; 438/486; 257/E21.134; 257/E21.347; 257/75; 257/66

(58) Field of Classification Search ................ 438/166, 438/487
See application file for complete search history.

(56) References Cited

U.S. PATENT DOCUMENTS

| 2003/0141505 A1 * | 7/2003 | Isobe et al. | 257/66 |
| 2003/0218169 A1 * | 11/2003 | Isobe et al. | 257/59 |
| 2006/0084212 A1 * | 4/2006 | Anderson et al. | 438/197 |
| 2006/0166456 A1 * | 7/2006 | Fujiwara et al. | 438/399 |

FOREIGN PATENT DOCUMENTS

JP 2001210017 2/2003

* cited by examiner

*Primary Examiner*—Jerome Jackson
*Assistant Examiner*—Paul Budd
(74) *Attorney, Agent, or Firm*—John J. Penny, Jr.; George N. Chaclas; Edwards Angell Palmer & Dodge, LLP

(57) ABSTRACT

A method of forming a crystal grain for use in a semiconductor manufacturing process, the method including the steps of forming an oxide silicon film on a glass substrate, etching at least one hole at a predetermined location in the oxide silicon film, forming an amorphous silicon film over the oxide silicon film, heating the amorphous silicon film such that a portion of the amorphous silicon film in the at least one hole is in a non-melting state and a substantial remainder of the amorphous silicon film is brought into a melting state, and allowing the amorphous silicon film to cool such that crystal growth is generated using the non-melting state portion as a crystal nucleus.

16 Claims, 5 Drawing Sheets

METHOD FOR MANUFACTURING BOTH A SEMICONDUCTOR CRYSTALLINE FILM AND SEMICONDUCTOR DEVICE

BACKGROUND

Priority is claimed to Japanese Application No. 2005-072711 filed on Mar. 15, 2005, which is hereby incorporated by reference in its entirety.

1. Technical Field

The present invention relates to a method for manufacturing a semiconductor device and a semiconductor device obtained by the same method.

2. Related Art

Conventionally, there is a method for manufacturing a thin film semiconductor device, such as one represented by a polycrystalline silicon thin film transistor (p-SiTFT), at a temperature no greater than around 600° C. at which a general-purpose glass substrate can be used, or at a temperature no greater than around 425° C. which is about the same temperature at which an amorphous silicon thin film transistor (a-SiTFT) is manufactured.

According to this method, a silicon oxide film, which is an insulation film used as a base protection film, is first deposited on a glass substrate, and an amorphous silicon film that becomes a semiconductor film is then deposited thereon. Then, a XeCl pulse excimer laser (at a wavelength of 308 nm) is irradiated onto this amorphous silicon film to turn it into a polycrystalline silicon film (a laser thermal treatment). In the laser thermal treatment, the temperature of the amorphous silicon film that has absorbed the laser light increases so as to melt the amorphous silicon film, and, when the temperature decreases, the melted silicon film is crystallized to produce the polycrystalline silicon film.

After the laser thermal treatment, the silicon oxide film that becomes a gate insulation film is formed by a chemical vapor deposition method (a CVD method) or a physical vapor deposition method (a PVD method). Then, by forming a gate electrode using tantalum or the like, a metal (gate electrode)—oxide film (gate insulation film)—semiconductor (polycrystalline silicon film) field effect transistor (MOSFET) is obtained. Finally, after depositing an interlayer insulation film on these films and then opening contact holes, wiring is provided using a metal thin film. As a consequence, a thin film semiconductor device is obtained.

However, with the conventional method for manufacturing the thin film semiconductor device, the energy density changes during the laser thermal treatment because it is difficult to control the energy density of the excimer laser light, and, thus, the quality of the semiconductor film varies largely. Particularly, this variation in the quality of the semiconductor film is notable with the laser irradiation conditions (e.g., radiation energy density) for forming a relatively high-quality polycrystalline semiconductor film. Therefore, in an actual manufacturing process, the energy density is set slightly lower than the optimal density when carrying out the laser irradiation. With the insufficient energy density, however, it is difficult to obtain a high-quality polycrystalline thin film.

Further, even if the laser radiation is carried out at the optimal radiation energy density to produce a relatively high-quality polycrystalline film, the produced silicon film is polycrystalline. A polycrystalline silicon film has a grain boundary at which a leak current occurs, for example, and the properties of the thin film semiconductor device formed thereon are not as good as those of the single-crystalline silicon. Moreover, because it is not possible to control the area where the grain boundary is generated, the properties of the thin film semiconductor device formed on this polycrystalline silicon film largely vary even within the same substrate.

In contrast, there is a known technique (e.g., see JP-A-2003-92260) by which a region having a hole in the center inside the surface of the amorphous silicon film is formed into a silicon film substantially in a single-crystalline state, by first making a hole in an insulation film on a substrate, forming an amorphous silicon film on this insulation film, irradiating this amorphous silicon film with a laser beam under predetermined conditions, and, while maintaining the amorphous silicon at the bottom part of the hole in a non-melting state and bringing the other part of the amorphous silicon film into a melting state, generating crystal growth using the amorphous silicon maintained in the non-melting state as a crystalline nucleus.

However, such a technique for forming the silicon film substantially in the single-crystalline state has some aspects that need to be improved as below.

The single crystal grain (the substantially single-crystalline grain) in the silicon film obtained by this technique has the upper limit (maximum) diameter of about 7 μm at the most. Thus, when forming a transistor in the single crystal grain, the channel cannot be made wide enough. Also, if the channel cannot be made wide enough, the capacity of the transistor cannot be expected to increase, since the amount of current flowing through the channel cannot be increased, for example.

SUMMARY OF THE INVENTION

An advantage of an embodiment of the invention is to provide a method for manufacturing a semiconductor device by which the channel width can be made sufficiently large so that the transistor capacity can increase, and to a semiconductor device obtained by the method.

According to an embodiment of the invention, a method for manufacturing a semiconductor device includes: forming a crystalline silicon film by a deposition method; providing the crystalline silicon film with a source region and a drain region; forming a plurality of paralleling fin-shaped channel portions in a surface direction of the crystalline silicon film by etching the crystalline silicon film; forming a gate insulation film on a surface portion of each channel portion; and forming a transistor by forming a gate electrode by covering part of the gate insulation film of each channel portion along the surface direction of the crystalline silicon film.

In this case, since the plurality of fin-shaped channel portions are formed in a manner that they lie in parallel with the surface direction of the crystalline silicon film, and since the gate electrode is formed covering part of each gate insulation film of each channel portion via the gate insulation film formed on the surface portion of each channel portion, the total channel width of all the channel portions may become the whole channel width of the resultant transistor. Accordingly, by increasing the number of the channel portions, the channel width may become sufficiently large, and, thus, the capacity of the obtained transistor may improve.

Further, since the gate electrode is formed covering part of the gate insulation film of each channel portion along the surface direction of the crystalline silicon film for all the plurality of paralleling channel portions, a double gate structure is formed at each channel portion when the gate electrodes are disposed on both sides of the fin-shaped channel portion. Therefore, if the gate length is short, the channel portion becomes completely depleted. Thus, by shortening the gate length, occurrence of punch through can be suppressed, and the transistor can be miniaturized.

It is preferable that, in the aforementioned method, the formation of the crystalline silicon film includes: forming a hole extending approximately perpendicular to a surface of an insulating substrate or of an insulation film deposited on a substrate at a predetermined position inside the surface; forming an amorphous silicon film on the insulating substrate or the insulation film by a deposition method; and turning a region having the hole in the center inside the surface of the amorphous silicon film into a crystalline silicon film substantially in a single-crystalline state by irradiating the amorphous silicon film with a laser beam and, while maintaining the amorphous silicon at the bottom part of the hole in a non-melting state and bringing the other part of the amorphous silicon film into a melting state, generating crystal growth using the amorphous silicon maintained in the non-melting state as a crystalline nucleus.

In this case, because the crystalline silicon film is substantially in the single-crystalline state, the properties of the transistor may further improve by forming the transistor in this crystalline silicon film.

In particular, by forming the source region, the drain region, and the channel portion in a single substantially single-crystalline grain of the crystalline silicon film, the properties of the transistor may improve notably in such a manner that there may be no leak current at the grain boundary.

According to another embodiment of the invention, the semiconductor device of the invention is a semiconductor device fabricated by forming at least one transistor containing a source region, a drain region, and a channel region in a single crystal grain, in that: a plurality of paralleling fin-shaped channel regions are formed by etching the crystalline silicon film; a gate insulation film is provided on a surface portion of each channel portion; and a gate electrode is provided covering part of the gate insulation film of each channel portion.

In this case, because the plurality of fin-shaped channel regions are formed in parallel, and because the gate electrode is formed on the surface portion of each channel portion via the insulation film, the total channel width of all the channel portions may become the whole channel width of the transistor. Therefore, if a number of channel portions are formed, the channel width may become sufficiently large by that number, and, thus, the capacity of the obtained transistor may improve.

Further, since the gate electrode is formed covering part of the gate insulation film of each channel portion by etching for all the plurality of channel portions, each channel portion takes the double gate structure when the gate electrodes are disposed on both sides of the fin-shaped channel portion. If the gate length is short, the channel portion becomes completely depleted. Thus, by shortening the gate length, occurrence of punch through can be suppressed, and the transistor can be miniaturized.

Moreover, since the transistor is formed in the single substantially single-crystalline grain, the properties of the transistor improve notably in such a manner that, for example, the leak current at the grain boundary may be greatly suppressed.

According to the aforementioned semiconductor device, in regard to the single crystal grain: a hole extending approximately perpendicular to a surface of an insulating substrate or an insulation film deposited on a substrate is formed at a predetermined position inside the surface; an amorphous silicon film is formed on the insulating substrate or on the insulation film by a deposition method; and the single crystal grain is substantially a single-crystalline grain composing the crystalline silicon film and is formed when a region having the hole in the center inside the surface of the amorphous silicon film is formed into a crystalline silicon film substantially in a single-crystalline state by irradiating the amorphous silicon film with a laser beam and, while maintaining the amorphous silicon at the bottom part of the hole in a non-melting state and bringing the other part of the amorphous silicon film into a melting state, generating crystal growth using the amorphous silicon maintained in a non-melting state as a crystalline nucleus.

In this case, the crystalline silicon film substantially in the single-crystalline state may be readily formed on the substrate. Thus, by forming the transistor in the substantially single-crystalline grain composing the crystalline silicon film, the properties of the transistor may further improve.

BRIEF DESCRIPTION OF THE DRAWINGS

The invention will be described with reference to the accompanying drawings, wherein like numbers reference like elements.

DESCRIPTION OF THE EMBODIMENT

An embodiment of the invention pertaining to the method for manufacturing the semiconductor device will now be described.

First, a process for forming a crystalline silicon film by a deposition method will be described. In the present embodiment, in particular, this crystalline-silicon-film forming process is for forming a crystalline silicon film substantially in a single-crystalline state on a glass substrate.

FIRST EXAMPLE

The first example of the method for forming the crystalline silicon film substantially in the single-crystalline state on the glass substrate will be described below.

Figure 1A:
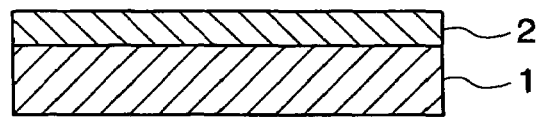
FIGS. 1A through 1F are diagrams explaining a process of a method for forming a crystalline silicon film of a first example.

First, as shown in FIG. 1A, a silicon oxide film (an insulation film) 2 is formed on a glass substrate 1. As a method for forming the oxide silicon film 2 on the glass substrate 1, a vapor deposition method such as a plasma-enhanced chemical vapor deposition method (a PECVD method), a low-pressure chemical vapor deposition method (a LPCVD method), or a sputtering method is suitably used. The film thickness of the oxide silicon film 2 is, for example, 100 nm-10 μm. In this example, the silicon oxide film 2 having a thickness of 1 μm is formed by the PECVD method.

Figure 1B:
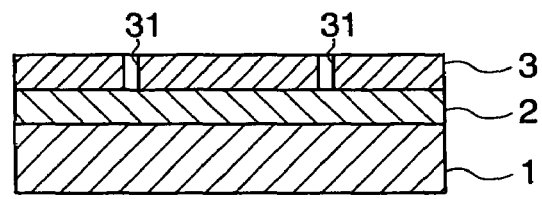

Next, as shown in FIG. 1B, a resist pattern 3 is formed on the silicon oxide film 2 by a photolithography technique. This resist pattern 3 has a through hole 31 at a position where a hole is formed inside the surface of the silicon oxide film 2.

Figure 1C:
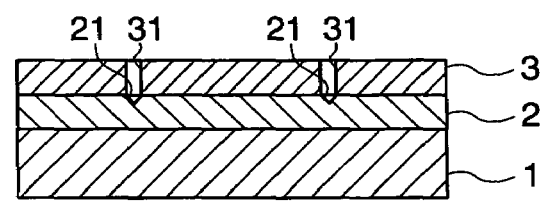

Thereafter, as shown in FIG. 1C, the silicon oxide film 2 below the through hole 31 is etched to produce a hole 21 at a predetermined position of the silicon oxide film 2. This etching is carried out by a reactive ion etching using the plasma of $CF_4$ gas and $H_2$ gas.

Further, by introducing a gas (e.g., a gas mixture of oxygen discharge gas or $NF_3$ discharge gas and vapor) during the etching to peel off the resist, the resist pattern 3 on the silicon oxide film 2 is gradually peeled off (carbonized) so that the cross-sectional surface of the hole 21 of the silicon oxide film 2 becomes bigger as the etching of the silicon oxide film 2 progresses.

Figure 1D:
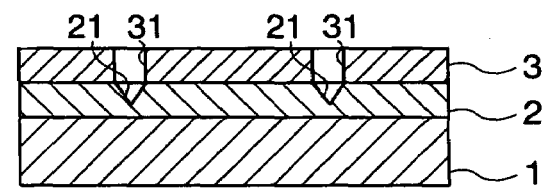

As a result, as shown in FIG. 1D, a quadrangular pyramid-shaped (that is, shaped in a manner that the cross-sectional surface of the hole 21 parallel to the surface of the silicon oxide film 2 becomes smaller towards the substrate 1 side) hole 21 extending perpendicular to the surface of the silicon oxide film 2 is formed in the silicon oxide film 2 at the position of the through hole 31 of the resist pattern 3. As for the size of the hole 21, the depth is 500 nm, and the side length of the square that makes the opening end of the hole 21 is 1 μm on a side, for example. Additionally, the shape of the hole 21 may be a trigonal pyramid or a circular cone.

Figure 1E:
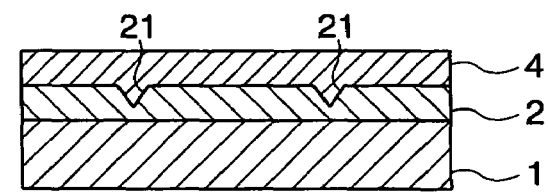

Next, after peeling off the resist pattern 3, as shown in FIG. 1E, an amorphous silicon film 4 having a predetermined thickness (a thickness greater than the depth of the hole 21, e.g., 50 nm-500 nm) is formed on the silicon oxide film 2. As a method for forming the amorphous silicon film 4, the PECVD method, the LPCVD method, an atmospheric pressure chemical vapor deposition (a APCVD method), or the sputtering method can be employed. In this example, the LPCVD method is employed in order to easily and reliably deposit a high-purity silicon film up to the tip of the bottom part of the quadrangular pyramid hole 21. Further, in substitution for the amorphous silicon oxide film 4, a polycrystalline silicon film may be formed.

Figure 1F:
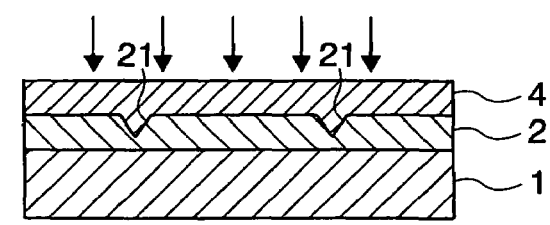
Figure 2A:
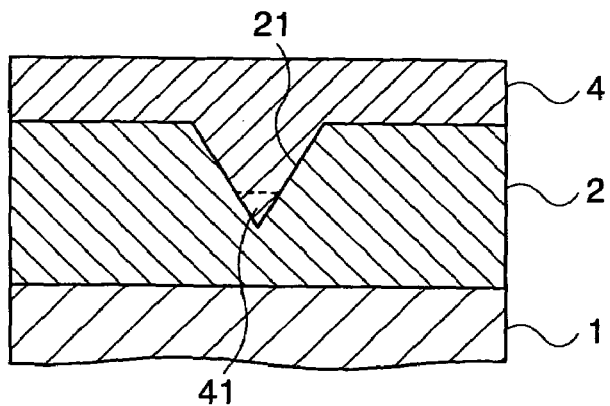
FIGS. 2A and 2B are cross-sectional diagrams explaining growth of a silicon film substantially in a single-crystalline state.

Next, as shown in FIG. 1F, a laser beam is irradiated to the amorphous silicon film 4. In this case, XeCl pulse excimer laser (having a wavelength of 308 nm and a pulse width of 30 nsec) is beamed at an energy density of 0.4-2.0 $J/cm^2$ (corresponding to the film thickness of 50 nm-500 nm of the amorphous silicon film 4). As a consequence, as shown in FIG. 2A, while maintaining an amorphous silicon 41 inside the bottom part of the hole 21 in the silicon oxide film 2 in a non-melting state, the other part of the amorphous silicon film 4 is brought into a complete melting state.

That is, most of the beamed XeCl pulse excimer laser is absorbed near the surface of the amorphous silicon film 4. This is because the absorption coefficients of the amorphous silicon and the crystalline silicon are as large as 0.139 $nm^{-1}$ and 0.149 $nm^{-1}$, respectively, with the XeCl pulse excimer laser at the wavelength of 308 nm.

Figure 2B:
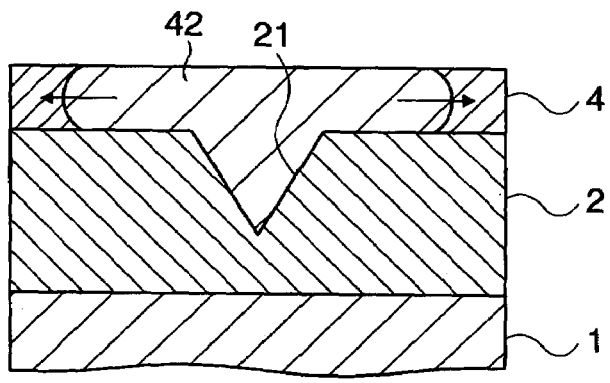

Consequently, when the temperature of the amorphous silicon film 4 decreases after the laser irradiation, the crystal growth is generated using the amorphous silicon 41, as the crystal nucleus, maintained in the non-melting state inside the bottom part of the hole 21 in the silicon oxide film 2. Then, as shown in FIG. 2B, a region 42 having the hole 21 in the center inside the surface of the amorphous silicon film 4 becomes the silicon substantially in the single-crystalline state (the substantially single-crystalline grain).

That is, by narrowing the bottom part of the quadrangular pyramid hole 21, the ratio of the volume of the silicon 41 in the non-melting state to the volume of the silicon in the melting state becomes extremely small, and, thereby, the place of the crystal nucleus against the melted silicon film is determined. By choosing the shape of the hole 21 and the energy density of the laser beam so as to sufficiently reduce the volume of the silicon 41 in the non-melting state, it can be considered that one crystal nucleus substantially contributes to the crystal growth. The inside of the hole 21 is then occupied by the crystal grains grown from this crystal nucleus and becomes substantially in the single-crystalline state. Then, the crystal growth progresses in the silicon film in the melting state at the upper part of the hole 21, eventually to form a large, substantially single-crystalline grain 42 having the hole 21 in the center.

Figure 3:
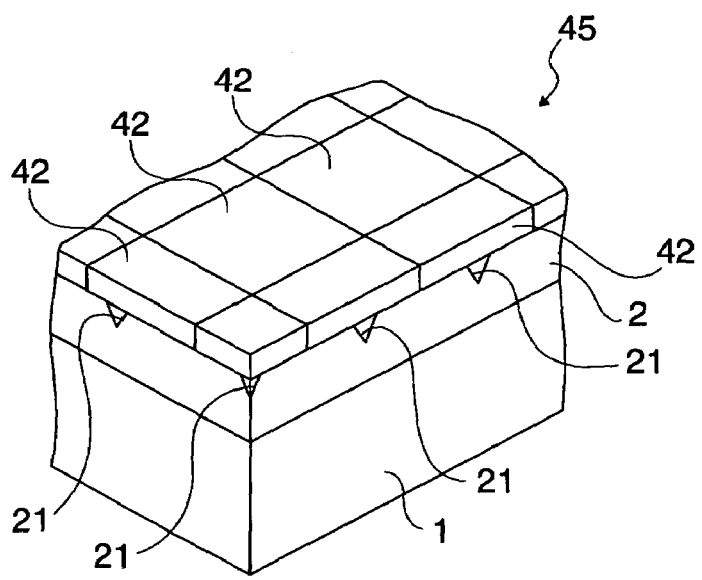
FIG. 3 is a perspective diagram showing the crystalline silicon film when holes are regularly arranged.

Accordingly, by first forming and arranging the holes 21 regularly at predetermined intervals as shown in FIG. 3, a crystalline silicon film 45, whose crystal grains 42 in the substantially single-crystalline state are aligned regularly corresponding to the arrangement of the holes 21, can be obtained.

This process enables the growth of a large crystal grain of about 4 μm, with the hole 21 being the center. Further, by adjusting the temperature of the sample at the time of the laser thermal treatment to be about 400° C., for example, an even a larger crystal grain of at least 7 μm can be obtained.

The inside of the crystal grain having the hole 21 in the center has few defects, and the crystal grain is substantially in the single-crystalline state. Consequently, in terms of the electric properties of the semiconductor film, this brings about an effect of lowering the trap level density near the central portion of the forbidden band within the energy band. Further, since there are no crystal grain boundaries, another effect is produced in that barriers against carriers such as electrons and holes can be greatly reduced. Therefore, by using such a semiconductor film as the active layer (e.g., the source, drain, and channel formation regions) of the thin film transistor, as will be described later, a high-performance transistor having a low off-state current and high mobility can be obtained.

By the described process, the silicon oxide film 2 is formed on the glass substrate 1 as shown in FIG. 1A, and the hole 21 is then formed in this silicon oxide film 2. However, instead, the hole 21 may be formed in the silicon oxide film 2 after forming a silicon nitride film on the glass substrate 1 and forming the silicon oxide film 2 on top of the silicon nitride film. In this case, the silicon nitride film has a thickness of 50 nm, and the silicon oxide film 2 has a thickness of 100 nm-10 μm, for example.

As a consequence, and because the insulation film on the substrate 1 has a two-layered structure containing the silicon nitride film and the silicon oxide film 2, the insulation film shields the heat generated during the laser thermal treatment from the substrate, and, thus, the effect in reducing the heat damage to the substrate is greater compared to the first example. Further, when impurities undesirable to the semiconductor film such as sodium, aluminum, or boron are included in the substrate, the two-layered structure of the insulation layer on the substrate can effectively prevent these impurities from diffusing from the substrate to the semiconductor film.

Further, since the laser thermal treatment is carried out on condition that the amorphous silicon film outside the bottom part of the hole 21 melts completely, the substrate can be damaged by the heat. However, the two-layered structure of the insulation layer on the substrate can reduce this heat damage. Due to these effects in reducing the heat damage and preventing the impurity diffusion, a thin film transistor having good properties can be obtained.

Moreover, instead of depositing the insulation film on the substrate, it is possible to use an insulating substrate in which the hole is directly formed.

SECOND EXAMPLE

Now, the second example of the method for forming the crystalline silicon film substantially in the single-crystalline state on the glass substrate will be described.

Figure 4A:
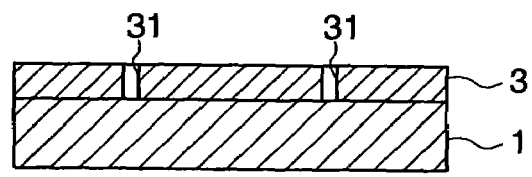
FIGS. 4A through 4F are diagrams explaining a process of a method for forming a crystalline silicon film of a second example.
Figure 4B:
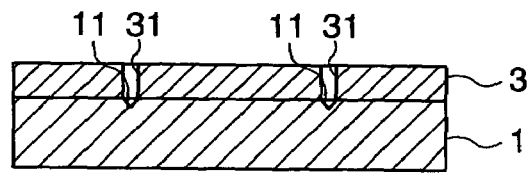

First, as shown in FIG. 4A, the resist pattern 3 is formed on the glass substrate 1 by the photolithography technique. This resist pattern 3 has a through hole 31 at a position where a hole is formed inside the surface of the silicon oxide film 2. Then, as shown in FIG. 4B, the glass substrate 1 below the through hole 31 is etched so as to produce a hole 11 at a predetermined position of the glass substrate 1.

The etching is carried out by the reactive ion etching using $CF_4$ gas and $H_2$ gas. Further, by introducing the gas (e.g., the gas mixture of oxygen discharge gas or $NF_3$ discharge gas and vapor) during the etching to peel off the resist, the resist pattern 3 on the glass substrate 1 is gradually peeled off (carbonized) so that the cross-sectional surface of the hole 11 of the glass substrate 1 becomes enlarged as the etching of the glass substrate 1 progresses.

Figure 4C:
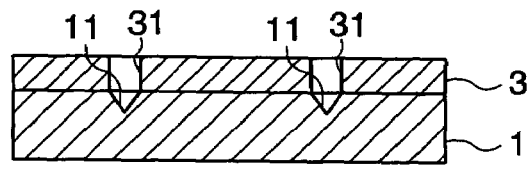

As a result, as shown in FIG. 4C, a quadrangular pyramid-shaped hole 11 extending perpendicular to the surface of the substrate is formed in the glass substrate 1 at the position of the through hole 31 of the resist pattern 3. As for the size of the hole 11, the depth is 1 μm, and the side length of the square that makes the opening end of the hole 11 is 1 μm on a side, for example.

Figure 4D:
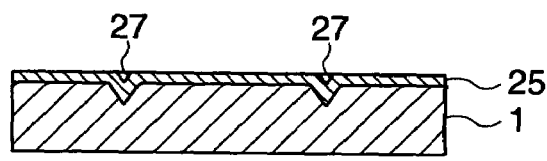

Next, after peeling off the resist pattern 3, a silicon oxide film (insulation film) 25 having a thickness of 400 nm-600 nm is formed on the glass substrate 1 by the PECVD method. Accordingly, as shown in FIG. 4D, the hole 11 is covered by the silicon oxide film 25, and a quadrangular pyramid-shaped hole 27 of 100 nm or less, which is smaller than the size of the previously described hole 11, is formed at a predetermined position inside the substrate surface.

Figure 4E:
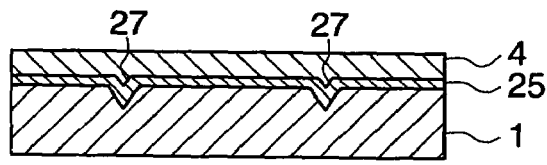

Thereafter, as shown in FIG. 4E, the amorphous silicon film 4 having a predetermined thickness (a thickness larger than the depth of the hole 27, e.g., 50 nm-500 nm) is formed on the silicon oxide film 25 by the LPCVD method. Further, in substitution for the amorphous silicon film 4, a polycrystalline silicon film may be formed.

Figure 4F:
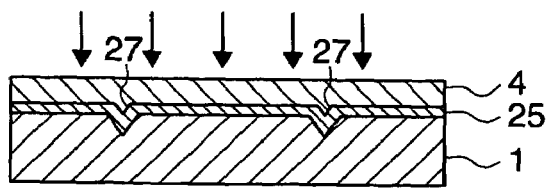

Next, as shown in FIG. 4F, a laser beam is irradiated to the amorphous silicon film 4. In this case, XeCl pulse excimer laser (having a wavelength of 308 nm and a pulse width of 30 nsec) is beamed at an energy density of 0.4-2.0 J/cm² (corresponding to the film thickness of 50 nm-500 nm of the amorphous silicon film 4).

As a consequence, while maintaining the amorphous silicon inside the bottom part of the hole 27 covered by the silicon oxide film 25 in a non-melting state, the other part of the amorphous silicon film 4 is brought into a complete melting state. Then, when the temperature of the amorphous silicon film 4 decreases after the laser irradiation, the crystal growth is generated using, as the crystal nucleus, the amorphous silicon maintained in the non-melting state inside the bottom part of the hole 27 covered by the silicon oxide film 25. Then, the region having the hole 27 in the center inside the surface of the amorphous silicon film 4 turns into the silicon substantially in the single-crystalline state (the substantially single-crystalline grain).

Accordingly, similarly to the first example, by first forming and arranging the holes 21 regularly at predetermined intervals, a crystalline silicon film is possible where the crystal grains, substantially in the single-crystalline state, are aligned regularly corresponding to the arrangement of the holes 27.

Now, a method for forming the transistor (the thin film transistor) on thus-obtained crystalline silicon film will be described.

Formation of the transistor is carried out by first obtaining a crystal grain having a thickness of about 250 nm and a diameter of about 5 μm by adjusting the temperature of the sample particularly at around 400° C. at the time of the laser thermal treatment in the above-described formation of the crystalline silicon film, and, then, by forming the active layer of the transistor, that is, the source, drain, and channel regions inside this single crystal grain (the substantially single-crystalline grain).

First, the structure of the transistor to be formed will be described with reference to FIG. 5.

Figure 5:
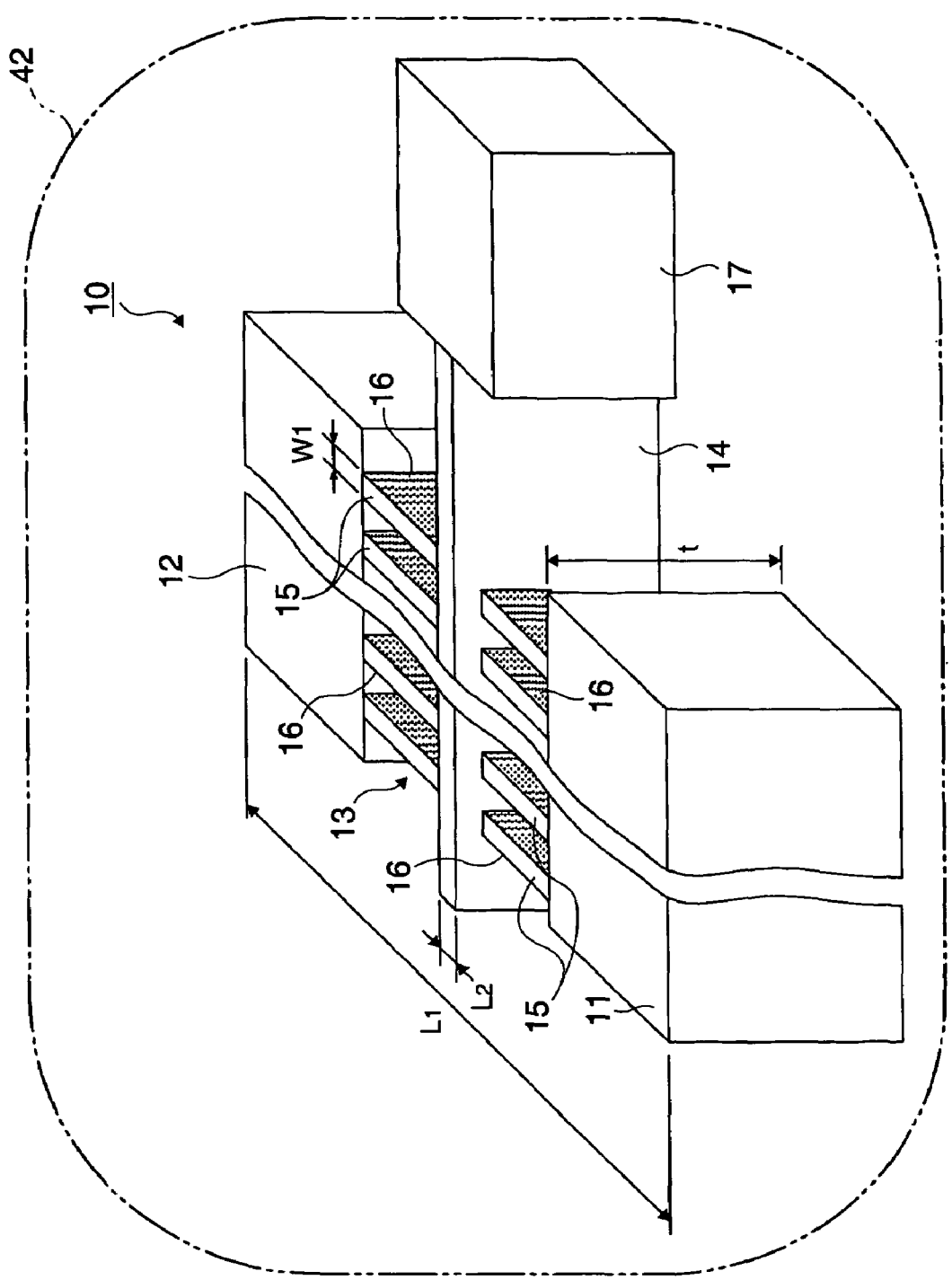
FIG. 5 is a perspective diagram showing an outline structure of a transistor that becomes a semiconductor device in accordance with the invention.

In FIG. 5, the reference number 42 indicates the substantially single-crystalline grain. A transistor (a thin film transistor) 10 that becomes the semiconductor device of the invention is formed in this substantially single-crystalline grain 42. The transistor 10 includes a source region 11, a drain region 12, and a channel region 13 in the substantially single-crystalline grain 42, that is, in the single crystal grain. The transistor 10 also includes a gate electrode 14 and is formed in a manner that the distance between the source region 11 and the drain region 12 expressed by L1 in FIG. 5 is about 3 μm.

The channel region 13 is formed between the source region 11 and the drain region 12 by etching the substantially single-crystalline grain 42. The channel region 13 has a structure containing a plurality of fin-shaped, that is, plate-shaped, channel portions 15 aligned in parallel to each other. In the embodiment, there are fifty channel portions 15 each having 30 nm in width as expressed by W1 in FIG. 5. In this case, each channel portion 15, source region 11, and drain region 12 composing the channel region 13 has the whole thickness of the crystalline silicon film composing the substantially single-crystalline grain 42. Accordingly, the thickness (expressed by t in FIG. 5) of each of the channel portions 15, source regions 11, and drain regions 12 is about 250 nm. Additionally, the plurality of channel portions 15 having such a structure are aligned in parallel in the surface direction of the crystalline silicon film.

Further, a gate insulation film 16 is formed on the surface portion of each of the channel portions 15, and the gate electrode 14 is formed covering part of each gate insulation film 16 of each of the channel portions 15. This gate electrode 14 is in a form of a plate extending in a direction perpendicular to each channel portion 15, covering the near-central portion of each channel portion 15 (the near-central portion between the source and drain regions 11 and 12). Thus, each channel portion 15 and the gate insulation film 16 on the surface portion of the channel portion 15 are preferably formed in a manner that they penetrate the gate electrode 15. The gate electrode 14 here has a width of about 30 nm, as expressed by L2 in FIG. 5, and, accordingly, the gate length of this gate electrode 14 is about 30 nm. One end of the gate electrode 14 is provided with a leading portion 17.

With the transistor 10 having such a configuration, the double gate structure is formed at each channel portion 15 in a manner that the gate electrodes 14 are formed covering part of each gate insulation film 16 of each channel portion 15 composing the channel region 13 and are arranged on both sides of the fin-shaped channel portion 15.

In addition, at each channel portion 15 composing the channel region 13 of the transistor 10 shown in FIG. 5, the part covered by the gate electrode 14 practically becomes the channel region, and, therefore, basically, the side of the source region 11 functions as the source region, and the side of the drain region 12 functions as the drain region.

Furthermore, because the plurality of fin-shaped channel portions 15 are aligned in parallel, and each surface portion of each channel portion 15 is provided with the gate electrode 14 via the gate insulation film 16, the channel width of the whole channel region 13, that is, the whole channel width of the transistor 10, becomes the total channel width of all the channel portions 15. In other words, the channel width of one surface of each channel portion 15 is 250 nm, which is the thickness expressed by t in FIG. 5, and, thus, the thickness of each channel portion 15 becomes 250 nm×2 equal 500 nm, since both surfaces of each channel portion 15 having the double gate structure function as the channels. Moreover, since there are fifty channel portions 15, the thickness becomes 500 nm×50 being 25 µm, and, therefore, the channel region 13 practically has the channel width of 25 µm.

Figure 6A:
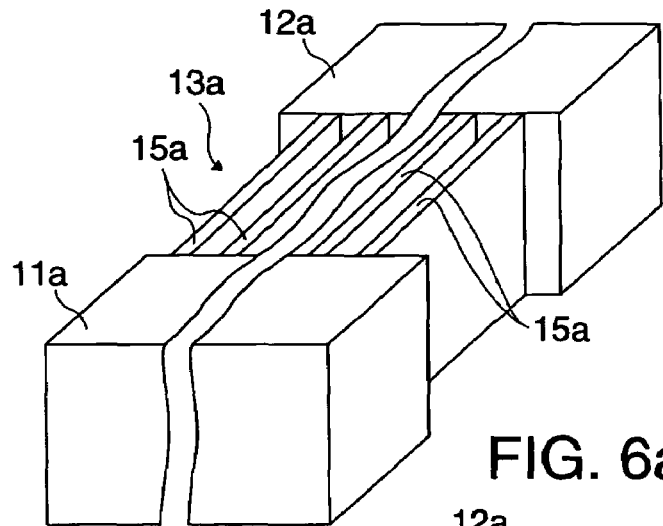
FIGS. 6A through 6C are diagrams showing a process for manufacturing the transistor shown in FIG. 5.

In order to form the transistor 10 having such a structure inside the substantially single-crystalline grain 42 in the described crystalline silicon film, this substantially single-crystalline grain 42 is first patterned to form a channel region 13a composed of a source region 11a, a drain region 12a, and a plurality of channel portions 15a as shown in FIG. 6A. Although not shown in the drawings, the source region 11a, drain region 12a, and channel portions 15a are to be formed on the silicon oxide film 2 on the glass substrate 1. Also, the holes 21 of the silicon oxide film 2 are allotted in a manner that they are not positioned in the formation regions of these source, drain, and channel regions 11a, 12a, and 13a in the substantially single-crystalline grain 42.

Figure 6B:
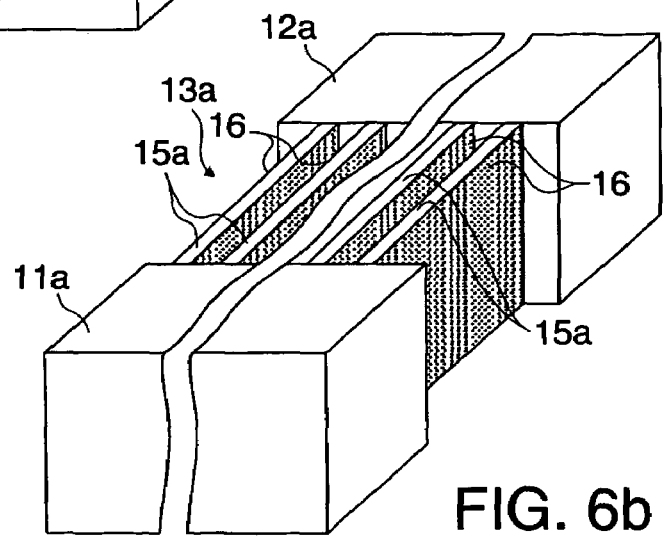

Next, as shown in FIG. 6B, by a thermal oxidation method or a direct plasma oxidation method using high density plasma, the gate insulation film 16 is formed by forming an oxide film having a thickness of about 2 nm on the surface portion of, that is, at least both surfaces of, each channel portion 15a. At the same time, an oxide film (now shown) is also formed on the surfaces of the source and drain regions 11a and 12a.

Figure 6C:
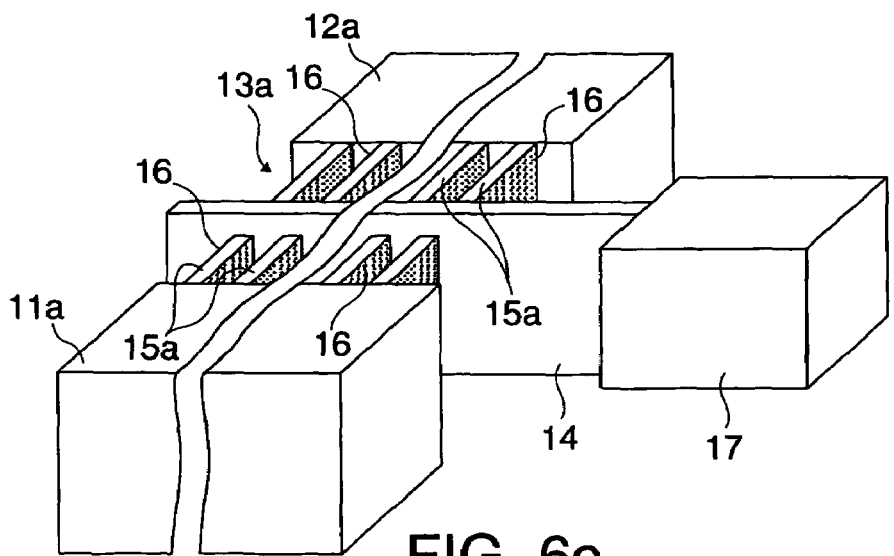

Then, a metal thin film made of titanium, tungsten, or the like is formed by the CVD method. Thereafter, the metal thin film is patterned by the reactive ion etching on condition that there is a sufficient selection ratio between the metal thin film and the silicon composing the source, drain, and channel regions 11a, 12a, and 13a so as to form the gate electrode 14 and its leading portion 17 as shown in FIG. 6C.

Thereafter, using this gate electrode 14 as a mask, impurity ions that become a donor or an acceptor are injected, and the source, drain, and channel regions 11a, 12a, and 13a are formed in a self-aligning manner against the gate electrode 14.

In this case, an NMOS transistor is produced. As the impurity element, phosphorus (P) at a density of $1\times10^{16}$ $cm^{-2}$ is injected to the source/drain region. Thereafter, either by irradiation with the XeCl excimer laser at an energy density of between 200 mJ/cm$^2$ or more and 400 mJ/cm$^2$ or less, or by thermal treatment at a temperature between about 250° C. and 550° C., the mentioned impurity element is activated to produce the transistor 10.

Then, by the PECVD method, the silicon oxide film (not shown) is formed covering this transistor 10, that is to say, the source region 11, the drain region 12, the channel regions 13, the gate electrode 14, and its leading portion 17.

Then, the silicon oxide film is etched to form a contact hole (not shown) that reaches to the source and drain regions 11 and 12 and a contact hole that reaches to the leading portion 17 of the gate electrode 14.

Thereafter, aluminum is deposited inside the contact hole and on the peripheral portion of the contact hole on the silicon oxide film by sputtering, thereby forming the source electrode connected to the source region 11, the drain electrode connected to the drain region 12, and the terminal electrode connected to the leading portion 17 of the gate electrode 14.

Because thus-produced transistor 10 is formed in a manner that the plurality of fin-shaped channel portions 15 are aligned in parallel and that each surface portion of each of the channel portions 15 is provided with the gate electrode 14 via the gate insulation film 16, the channel width of the whole channel region 13, that is, the channel width of the whole transistor 10, becomes the total channel width of all the channel portions 15. Since there are fifty channel regions 15 with a sufficiently large channel width as described, the capacity of the transistor 10 improves sufficiently in such a manner that, for example, the amount of current flowing in the channels increases.

Further, because the gate electrodes 14 are arranged on both sides of the fin-shaped channel portion 15 for all the plurality of channel portions 15 that are formed in parallel by etching, each channel portion 15 takes the double gate structure in which the gate electrodes 14 are arranged on both sides of the fin-shaped channel portion 15. Thus, even if the gate length is set relatively short at 30 nm as in the embodiment, the occurrence of punch through can be reliably suppressed. Therefore, by making the gate length to be shorter than 30 nm, for example, it is possible to miniaturize the transistor and to thereby raise the frequency.

Moreover, since the transistor 10 is formed in the single substantially single-crystalline grain 42, it is possible to make the channel region 13 out of a region having very few crystal boundaries and defaults inside the crystal grain that interfere with the carrier flow, and, therefore, the properties of the transistor 10 improve notably in such a manner that there may be no leak current at the grain boundary.

Additionally, the invention is not limited to the embodiments shown and described and may allow various modifications within the spirit and scope of the invention. Although one transistor is formed in the single crystal grain (the substantially single-crystalline grain) in the embodiments described, two transistors, a p-channel transistor and an n-channel MOS transistor, may be formed, for example.

Further, although the glass substrate is used as the substrate in the embodiment, the invention is not limited thereto, and a quartz glass substrate, a silicon substrate, or a highly heat-resistant plastic substrate may also be used, for example.

Moreover, in the embodiments described, the channel region 13 is structured by forming the fifty fin-shaped channel portions. However, the number of the channel portions 15 is suitably decided depending on the channel width required for the formation of the transistor.

Furthermore, in the embodiment shown, the holes formed in the silicon oxide film (the insulation film) are particularly made to become smaller towards the substrate side. However, the holes may have an inner diameter that is approximately uniform along with other modifications as would be appreciated by those of ordinary skill in the art upon review of the subject disclosure.

What is claimed is:

1. A method for manufacturing a semiconductor device, comprising the steps of:
   forming a crystalline silicon film on a substrate, the crystalline silicon film having a thickness, wherein the formation of the crystalline silicon film is by deposition including the steps of:
   i) forming a hole in the substrate such that the hole extends approximately perpendicular to the length at a predetermined position;
   ii) forming an amorphous silicon film on the substrate such that the hole is filled with the amorphous silicon film; and
   iii) turning a region of the amorphous silicon film about the hole into a crystalline silicon film in a single-crystalline state or a polycrystalline state or any mixture of both states by irradiating the region with a laser beam and, while maintaining the amorphous silicon film at a bottom part of the hole in a non-melting state and bringing a remainder of the amorphous silicon film into a melting state to thereby generate crystal growth using the amorphous silicon maintained in the non-melting state as a crystalline nucleus as the amorphous silicon film cools;
   providing the crystalline silicon film with a source region, a channel region and a drain region, wherein a distance from the source region to the drain region defines an approximate length of the semiconductor device;
   forming a plurality of fin-shaped channel portions extending parallel to the length and between the source region and the drain region, wherein the source region, the drain region, and the channel portions are formed in a single single-crystalline grain of the crystalline silicon film;
   forming a gate insulation film on a surface portion of each channel portion; and
   forming a transistor by forming a gate electrode by covering part of the gate insulation film of each channel portion.

2. The method for manufacturing the semiconductor device according to claim 1, wherein the forming of the plurality of fin-shaped channel portions is by etching the crystalline silicon film.

3. The method for manufacturing the semiconductor device according to claim 1, wherein the hole is quadrangular pyramid-shaped.

4. The method for manufacturing the semiconductor device according to claim 3, wherein the source region, the channel region and the drain region extend across the thickness.

5. The method for manufacturing the semiconductor device according to claim 1, wherein the gate electrode is a plate extending perpendicular to the length.

6. The method for manufacturing the semiconductor device according to claim 1, wherein the substrate is an insulation film.

7. The method for manufacturing the semiconductor device according to claim 1, wherein the substrate is insulating glass.

8. A method as recited in claim 1, wherein the length of the semiconductor device is about 3 um.

9. A method of forming a crystal grain for use in a semiconductor manufacturing process, the method comprising the steps of:
   (a) forming an oxide silicon film on a glass substrate;
   (b) etching at least one hole at a predetermined location in the oxide silicon film;
   (c) forming an amorphous silicon film over the oxide silicon film after step (b);
   (d) heating the amorphous silicon film such that a portion of the amorphous silicon film in the at least one hole is in a non-melting state and a remainder of the amorphous silicon film is brought into a melting state; and
   (e) allowing the amorphous silicon film to cool such that crystal growth is generated using the non-melting state portion as a crystal nucleus.

10. A method as recited in claim 9, wherein the at least one hole is a plurality of holes located such that the amorphous silicon film becomes a substantially single-crystalline grain free of crystal grain boundaries.

11. A method for manufacturing a semiconductor device, comprising the steps of:
    forming a crystalline silicon film on a substrate, the crystalline silicon film having a thickness, wherein the formation of the crystalline silicon film is by deposition including the steps of:
    i) forming a hole in the substrate such that the hole extends approximately perpendicular to the length at a predetermined position;
    ii) forming an amorphous silicon film on the substrate such that the hole is filled with the amorphous silicon film; and
    iii) turning a region of the amorphous silicon film about the hole into a crystalline silicon film is in a single-crystalline state or a polycrystalline state or any mixture of both states by irradiating the region with a laser beam and, while maintaining the amorphous silicon film at a bottom part of the hole in a non-melting state and bringing a remainder of the amorphous silicon film into a melting state to thereby generate crystal growth using the amorphous silicon maintained in the non-melting state as a crystalline nucleus as the amorphous silicon film cools;
    providing the crystalline silicon film with a source region, a channel region and a drain region, wherein a distance from the source region to the drain region defines an approximate length of the semiconductor device;
    forming a plurality of fin-shaped channel portions extending parallel to the length and between the source region and the drain region;
    forming a gate insulation film on a surface portion of each channel portion; and
    forming a transistor by forming a gate electrode by covering part of the gate insulation film of each channel portion.

12. The method for manufacturing the semiconductor device according to claim 11, wherein the hole is quadrangular pyramid-shaped.

13. The method for manufacturing the semiconductor device according to claim 11, wherein the gate electrode is a plate extending perpendicular to the length.

14. The method for manufacturing the semiconductor device according to claim 11, wherein the substrate is an insulation film.

15. The method for manufacturing the semiconductor device according to claim 11, wherein the substrate is insulating glass.

16. The method for manufacturing the semiconductor device according to claim 11, wherein the source region, the channel region and the drain region extend across the thickness.

* * * * *